United States Patent
Lee et al.

(10) Patent No.: US 9,345,141 B2
(45) Date of Patent: May 17, 2016

(54) MULTILAYER CERAMIC CAPACITOR AND PRINTED CIRCUIT BOARD INCLUDING THE SAME

(71) Applicant: SAMSUNG ELECTRO-MECHANICS CO., LTD., Suwon-si (KR)

(72) Inventors: Seung Eun Lee, Seongnam-si (KR);
Byoung Hwa Lee, Seongnam-si (KR);
Yee Na Shin, Suwon-si (KR); Yul Kyo Chung, Yongin-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 281 days.

(21) Appl. No.: 14/049,701

(22) Filed: Oct. 9, 2013

(65) Prior Publication Data
US 2014/0116761 A1   May 1, 2014

(30) Foreign Application Priority Data
Oct. 31, 2012   (KR) .......................... 10-2012-0122149

(51) Int. Cl.
*H01G 4/30* (2006.01)
*H05K 1/18* (2006.01)
(Continued)

(52) U.S. Cl.
CPC .............. *H05K 1/185* (2013.01); *H01G 4/232* (2013.01); *H01G 4/30* (2013.01); *H05K 1/0271* (2013.01);
(Continued)

(58) Field of Classification Search
CPC ......... H01G 4/232; H01G 4/228; H01G 4/30; H01G 4/252

USPC ........ 361/306.3, 306.1, 309, 303, 301.4, 305, 361/321.1, 321.2
See application file for complete search history.

(56) References Cited

U.S. PATENT DOCUMENTS

| | | | |
|---|---|---|---|
| 2003/0011959 A1* | 1/2003 | Moriwaki | H01G 4/228 361/308.1 |
| 2008/0013252 A1 | 1/2008 | Nakano | |

(Continued)

FOREIGN PATENT DOCUMENTS

| | | |
|---|---|---|
| JP | 8-130170 | 5/1996 |
| JP | 9-190946 | 7/1997 |

(Continued)

OTHER PUBLICATIONS

Korean Office Action mailed Dec. 16, 2013 in corresponding Korean Application No. 10-2012-0122149.
(Continued)

*Primary Examiner* — Nguyen T Ha
(74) *Attorney, Agent, or Firm* — NSIP Law

(57) ABSTRACT

The present invention relates to a multilayer ceramic capacitor and a printed circuit board including the same that can minimize thickness deviations of an external electrode and a multilayer ceramic. A multilayer ceramic capacitor according to an embodiment of the present invention includes a multilayer ceramic and external electrodes formed on both sides of the multilayer ceramic, wherein $|T_{max}-T_{min}|$ may be less than 10 μm, and $|CT_{max}-CT_{min}|$ may be less than 20 μm. (Here, $T_{max}$ is a maximum thickness of the external electrodes in a via processing area, $T_{min}$ is a minimum thickness of the external electrodes in the via processing area, $CT_{max}$ is a maximum thickness of the multilayer ceramic capacitor in the via processing area, and $CT_{min}$ is a minimum thickness of the multilayer ceramic capacitor in the via processing area.)

28 Claims, 2 Drawing Sheets

(51) Int. Cl.
*H01G 4/232* (2006.01)
*H05K 1/02* (2006.01)
*H05K 3/00* (2006.01)

(52) U.S. Cl.
CPC ............ *H05K 3/0035* (2013.01); *H05K 3/0047* (2013.01); *H05K 2201/10015* (2013.01); *H05K 2201/10636* (2013.01); *Y02P 70/611* (2015.11)

(56) References Cited

U.S. PATENT DOCUMENTS

| | | | | |
|---|---|---|---|---|
| 2009/0067117 A1* | 3/2009 | Kasuya | ................. | H01G 4/005 361/321.2 |
| 2009/0190285 A1* | 7/2009 | Kusano | ................. | H01G 4/232 361/321.4 |

FOREIGN PATENT DOCUMENTS

| | | | | | |
|---|---|---|---|---|---|
| JP | 09190946 | A | * | 7/1997 | ............... H01G 4/30 |
| JP | 2001-338832 | | | 12/2001 | |
| JP | 2001338832 | A | * | 12/2001 | ............... H01G 4/30 |
| JP | 2002134351 | A | * | 5/2002 | ............... H01G 4/12 |
| JP | 2004-228093 | | | 8/2004 | |
| JP | 2005-123407 | | | 5/2005 | |
| JP | 2005123407 | A | * | 5/2005 | ............. H01G 4/232 |
| JP | 2008-41786 | | | 2/2008 | |
| JP | 2010-123865 | | | 6/2010 | |
| JP | 2010123865 | A | * | 6/2010 | ............... H01G 4/12 |

OTHER PUBLICATIONS

Japanese Office Action dated Oct. 7, 2014 in corresponding Japanese Patent Application No. 2013-224055.

* cited by examiner

MULTILAYER CERAMIC CAPACITOR AND PRINTED CIRCUIT BOARD INCLUDING THE SAME

This application claims the benefit under 35 U.S.C. Section 119 of Korean Patent Application Serial No. 10-2012-0122149, filed Oct. 31, 2012, which is hereby incorporated by reference in its entirety into this application.

BACKGROUND OF THE INVENTION

1. Field of the Invention

The present invention relates to a multilayer ceramic capacitor and a printed circuit board including the same, and more particularly, to a multilayer ceramic capacitor that can minimize thickness deviations of an external electrode and a multilayer ceramic, and a printed circuit board including the same.

2. Description of the Related Art

A multilayer ceramic capacitor embedded in a printed circuit board, that is, an embedded multilayer ceramic capacitor (MLCC) is electrically connected to a circuit layer through a via hole. In an external electrode of the MLCC, it is required to minimize a thickness deviation of the MLCC since failures may occur in a portion in which a via hole region is processed by laser due to a thickness deviation of an insulating layer of the printed circuit board.

Further, the thickness of a core and a build-up layer should be reduced according to a reduction in the thickness of the printed circuit board. However, as the thickness of the build-up layer is reduced, a failure rate due to the thickness deviation of the MLCC is increased. In addition, as the thickness of the printed circuit board is reduced, a low CTE material is used as a material of a substrate due to a warpage problem. In this case, since flowability of a resin is low, there may be problems with filling the resin when the thickness deviation of the MLCC is large.

Further, the size of a via becomes smaller according to the need for a fine pitch. When the thickness of the external electrode of the MLCC is not uniform, a failure rate due to the bottom size of the via is increased.

Further, in some cases, more than 30 layers of the MLCCs are embedded according to a high current of an IC. In this case, the uniformity of the entire thickness of the MLCC and the thickness of the external electrode is rapidly deteriorated and thus failures occur in large quantities in processing the via by laser.

Therefore, it is required to minimize a failure rate in processing the via by minimizing a deviation of each of the entire thickness of the MLCC embedded in the printed circuit board and the thickness of the external electrode of the MLCC.

RELATED ART DOCUMENT

Patent Document

Patent Document 1: U.S. Patent Laid-open Publication No. 2008/0013252 A1

SUMMARY OF THE INVENTION

The present invention has been invented in order to overcome the above-described problems and it is, therefore, an object of the present invention to provide a multilayer ceramic capacitor and a printed circuit board including the same that can remove failures due to a thickness deviation of a multilayer ceramic capacitor and overcome problems with filling of a resin by minimizing a thickness deviation of a multilayer ceramic or an external electrode of the multilayer ceramic capacitor.

In accordance with one aspect of the present invention to achieve the object, there is provided a multilayer ceramic capacitor including: a multilayer ceramic and external electrodes formed on both sides of the multilayer ceramic, wherein $|T_{max}-T_{min}|$ may be less than 10 μm, and $|CT_{max}-CT_{min}|$ may be less than 20 μm. (Here, $T_{max}$ is a maximum thickness of the external electrodes in a via processing area, $T_{min}$ is a minimum thickness of the external electrodes in the via processing area, $CT_{max}$ is a maximum thickness of the multilayer ceramic capacitor in the via processing area, and $CT_{min}$ is a minimum thickness of the multilayer ceramic capacitor in the via processing area.)

Here, $|T_{max\_L}-T_{max\_R}|$ may be less than 5 μm, and $|CT_{max\_L}-CT_{max\_R}|$ may be less than 10 μm. (Here, $T_{max\_L}$ is a maximum thickness of the external electrodes in a left via processing area, $T_{max\_R}$ is a maximum thickness of the external electrodes in a right via processing area, $CT_{max\_L}$ is a maximum thickness of the multilayer ceramic capacitor in the left via processing area, and $CT_{max\_R}$ is a maximum thickness of the multilayer ceramic capacitor in the right via processing area.)

The multilayer ceramic may include a dummy pattern; and a capacitance forming pattern having a different polarity from the dummy pattern and formed on the same layer as the dummy pattern, wherein the dummy pattern and the capacitance forming pattern may be formed in more than 30 layers.

The external electrodes may be formed by dipping the both sides of the multilayer ceramic in an external electrode forming paste, wherein a viscosity of the external electrode forming paste may be less than 18,000 cps.

The external electrodes may be formed by performing blotting within 3 to 20 seconds.

The external electrodes may be formed of the external electrode forming paste which is put in a surface plate at a height of 30 to 100 μm during blotting.

The multilayer ceramic may include a first dummy pattern; a first capacitance forming pattern having a different polarity from the first dummy pattern and formed on the same layer as the first dummy pattern; a second dummy pattern having the same polarity as the first dummy pattern and formed on a different layer from the first dummy pattern; and a second capacitance forming pattern having a different polarity from the second dummy pattern and formed on the same layer as the second dummy pattern, wherein an interval between the first dummy pattern and the first capacitance forming pattern may be equal to an interval between the second dummy pattern and the second capacitance forming pattern, and a length of the first dummy pattern may be longer than a length of the second dummy pattern.

A ratio of a difference in length between the first capacitance forming pattern and the second capacitance forming pattern to the interval between the first dummy pattern and the first capacitance forming pattern may be 0.7 to 1.

The first dummy pattern and the second dummy pattern may be stacked vertically with one ceramic insulating layer interposed therebetween.

The multilayer ceramic may further include a third dummy pattern having a different polarity from the first dummy pattern and formed with the same length as the first dummy pattern; a third capacitance forming pattern having a different polarity from the first capacitance forming pattern and formed with the same length as the first capacitance forming pattern; a fourth dummy pattern having a different polarity from the second dummy pattern and formed with the same length as the second dummy pattern; and a fourth capacitance forming pattern having a different polarity from the second capacitance forming pattern and formed with the same length as the second capacitance forming pattern.

The third dummy pattern and the third capacitance forming pattern may be formed on the same layer, and the fourth dummy pattern and the fourth capacitance forming pattern may be formed on the same layer.

The third dummy pattern may be formed between the first capacitance forming pattern and the second capacitance forming pattern, and the fourth dummy pattern may be formed under the second capacitance forming pattern with one ceramic insulating layer interposed therebetween.

The first dummy pattern and the first capacitance forming pattern, the second dummy pattern and the second capacitance forming pattern, the third dummy pattern and the third capacitance forming pattern, and the fourth dummy pattern and the fourth capacitance forming pattern may be plural.

In accordance with another aspect of the present invention to achieve the object, there is provided a printed circuit board including: a multilayer ceramic capacitor including a multilayer ceramic and external electrodes formed on both sides of the multilayer ceramic; a core layer having a cavity for mounting the multilayer ceramic capacitor therein; an insulating layer formed between the multilayer ceramic capacitor and the cavity and on upper and lower surfaces of the core layer; via holes formed in the insulating layer for electrical conduction of the external electrodes; and circuit layers formed on the insulating layer, wherein $|T_{max}-T_{min}|$ of the multilayer ceramic capacitor may be less than 10 μm, and $|CT_{max}-CT_{min}|$ of the multilayer ceramic capacitor may be less than 20 μm. (Here, $T_{max}$ is a maximum thickness of the external electrodes in a via processing area, $T_{min}$ is a minimum thickness of the external electrodes in the via processing area, $CT_{max}$ is a maximum thickness of the multilayer ceramic capacitor in the via processing area, and $CT_{min}$ is a minimum thickness of the multilayer ceramic capacitor in the via processing area.)

Here, $|T_{max\_L}-T_{max\_R}|$ may be less than 5 μm, and $|CT_{max\_L}-CT_{max\_R}|$ may be less than 10 μm. (Here, $T_{max\_L}$ is a maximum thickness of the external electrodes in a left via processing area, $T_{max\_R}$ is a maximum thickness of the external electrodes in a right via processing area, $CT_{max\_L}$ is a maximum thickness of the multilayer ceramic capacitor in the left via processing area, and $CT_{max\_R}$ is a maximum thickness of the multilayer ceramic capacitor in the right via processing area.)

The via holes may include a first via hole; and a second via hole, wherein the first via hole and the second via hole may be formed in an upper portion of the insulating layer or formed in a lower portion of the insulating layer.

The via holes may include a first via hole having a positive polarity; and a second via hole having a negative polarity, wherein the first via hole and the second via hole may be formed in the upper and lower portions of the insulating layer, respectively or formed in the lower and upper portions of the insulating layer, respectively.

The multilayer ceramic may include a dummy pattern; and a capacitance forming pattern having a different polarity from the dummy pattern and formed on the same layer as the dummy pattern, wherein the dummy pattern and the capacitance forming pattern may be formed in more than 30 layers.

The external electrodes may be formed by dipping the both sides of the multilayer ceramic in an external electrode forming paste, wherein a viscosity of the external electrode forming paste may be less than 18,000 cps.

The external electrodes may be formed by performing blotting within 3 to 20 seconds.

The external electrodes may be formed of the external electrode forming paste which is put in a surface plate at a height of 30 to 100 μm during blotting.

The multilayer ceramic may include a first dummy pattern; a first capacitance forming pattern having a different polarity from the first dummy pattern and formed on the same layer as the first dummy pattern; a second dummy pattern having the same polarity as the first dummy pattern and formed on a different layer from the first dummy pattern; and a second capacitance forming pattern having a different polarity from the second dummy pattern and formed on the same layer as the second dummy pattern, wherein an interval between the first dummy pattern and the first capacitance forming pattern may be equal to an interval between the second dummy pattern and the second capacitance forming pattern, and a length of the first dummy pattern may be longer than a length of the second dummy pattern.

A ratio of a difference in length between the first capacitance forming pattern and the second capacitance forming pattern to the interval between the first dummy pattern and the first capacitance forming pattern may be 0.7 to 1.

The first dummy pattern and the second dummy pattern may be stacked vertically with one ceramic insulating layer interposed therebetween.

The multilayer ceramic may further include a third dummy pattern having a different polarity from the first dummy pattern and formed with the same length as the first dummy pattern; a third capacitance forming pattern having a different polarity from the first capacitance forming pattern and formed with the same length as the first capacitance forming pattern; a fourth dummy pattern having a different polarity from the second dummy pattern and formed with the same length as the second dummy pattern; and a fourth capacitance forming pattern having a different polarity from the second capacitance forming pattern and formed with the same length as the second capacitance forming pattern.

The third dummy pattern and the third capacitance forming pattern may be formed on the same layer, and the fourth dummy pattern and the fourth capacitance forming pattern may be formed on the same layer.

The third dummy pattern may be formed between the first capacitance forming pattern and the second capacitance forming pattern, and the fourth dummy pattern may be formed under the second capacitance forming pattern with one ceramic insulating layer interposed therebetween.

The first dummy pattern and the first capacitance forming pattern, the second dummy pattern and the second capacitance forming pattern, the third dummy pattern and the third capacitance forming pattern, and the fourth dummy pattern and the fourth capacitance forming pattern may be plural.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERABLE EMBODIMENTS

Hereinafter, specific embodiments of the present invention will be described with reference to the drawings. The following embodiments merely illustrate the present invention, and it should not be interpreted that the scope of the present invention is limited to the following embodiments.

In describing the present invention, descriptions of well-known components and processing techniques are omitted so as not to unnecessarily obscure the embodiments of the present invention. The following terms are defined in consideration of functions of the present invention and may be changed according to users or operator's intentions or customs. Thus, the terms shall be defined based on the contents described throughout the specification.

The technical sprit of the present invention should be defined by the attached claims, and the following embodiments are provided as examples to efficiently convey the technical spirit of the invention to those skilled in the art.

Hereinafter, the present invention will be described with reference to the accompanying drawings.

Figure 1:
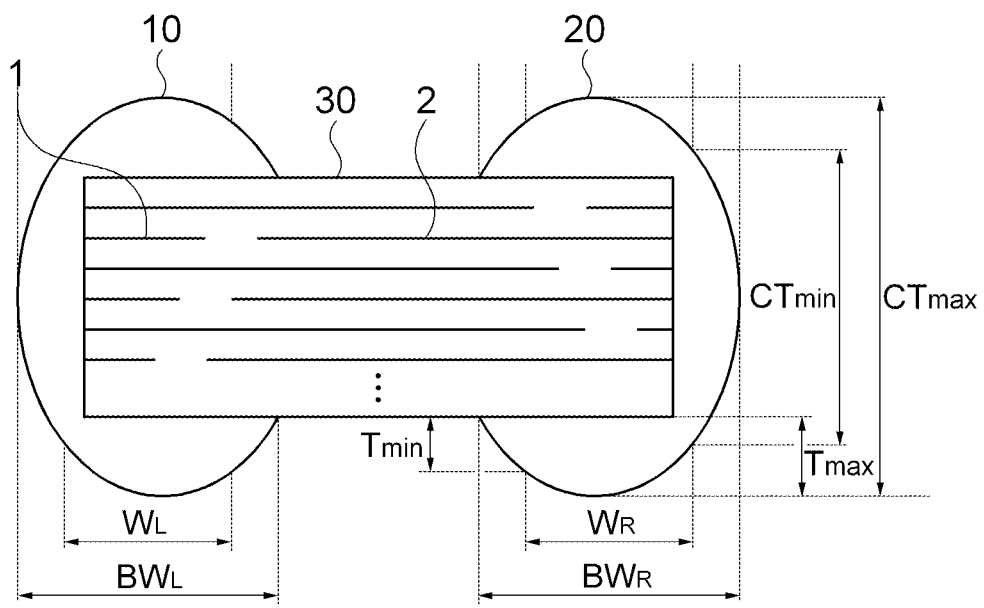
FIG. 1 is a cross-sectional view of a multilayer ceramic capacitor in accordance with an embodiment of the present invention.
Figure 2:
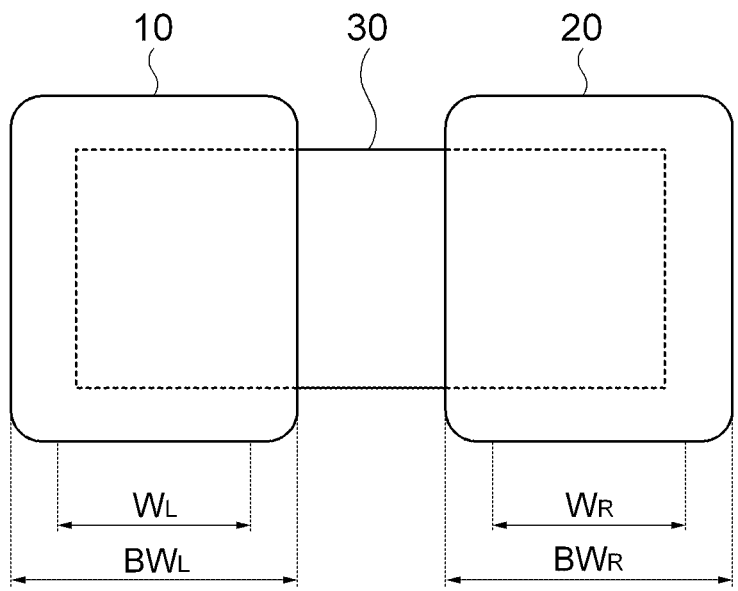
FIG. 2 is a plan view of the multilayer ceramic capacitor in accordance with the embodiment of the present invention.

FIG. 1 is a cross-sectional view of a multilayer ceramic capacitor in accordance with an embodiment of the present invention, and FIG. 2 is a plan view of the multilayer ceramic capacitor in accordance with the embodiment of the present invention.

Referring to FIGS. 1 and 2, a multilayer ceramic capacitor 50 in accordance with an embodiment of the present invention includes a multilayer ceramic 30 and external electrodes 10 and 20 formed on both sides of the multilayer ceramic 30, wherein $|T_{max}-T_{min}|$ may be less than 10 µm, and $|CT_{max}-CT_{min}|$ may be less than 20 µm. (Here, $T_{max}$ is a maximum thickness of the external electrodes 10 and 20 in a via processing area, $T_{min}$ is a minimum thickness of the external electrodes 10 and 20 in the via processing area, $CT_{max}$ is a maximum thickness of the multilayer ceramic capacitor 50 in the via processing area, and $CT_{min}$ is a minimum thickness of the multilayer ceramic capacitor 50 in the via processing area.) Meanwhile, BW represents the entire width, that is, a bandwidth of the external electrodes 10 and 20 formed on both ends of the multilayer ceramic 30 in the multilayer ceramic capacitor, and $BW_L$ and $BW_R$ represent a left bandwidth and a right bandwidth of the multilayer ceramic 30, respectively. W represents the via processing area in the multilayer ceramic 30, and $W_L$ and $W_R$ represent a left via processing area and a right via processing area of the multilayer ceramic 30, respectively. At this time, W may be set as an area corresponding to 95% of BW.

Here, the reason for setting W, which is the via processing area, as the area corresponding to 95% of BW, which is the entire width of the external electrode, is because it corresponds to an area in which contact efficiency between a bottom of a lower end of a via and a surface of the external electrode can be maximized when forming the via so that the lower end of the via is contacted within the bandwidth of the external electrodes 10 and 20. That is, it is because contact reliability may be deteriorated due to non-filling of a conductive material etc. when forming the via in a curved area since an outer side of the external electrode is formed curvedly.

When a thickness deviation ($|T_{max}-T_{min}|$) formed by the thickest portion and the thinnest portion of the external electrodes 10 and 20 themselves in the respective areas $W_L$ and $W_R$ exceeds 10 µm, since a radius of curvature of the external electrodes 10 and 20 is reduced, failure may occur when processing a via hole. Here, the failure may mean that the via hole reaches the surface of the external electrode in a portion in which the external electrode is thick but the via hole doesn't reach the surface of the external electrode in a portion in which the external electrode is thin when processing the via hole by laser etc. Otherwise, the failure may mean that failure of electrical connection occurs or a reliability problem occurs later since the via hole reaches only a minute area even though the via hole reaches the external electrode and thus a bottom size of the via doesn't reach a minimum value.

Even when the thickness deviation of the external electrodes 10 and 20 is less than 10 µm, if a thickness deviation ($|CT_{max}-CT_{min}|$) of the multilayer ceramic capacitor 50 exceeds 20 µm, the above failure may occur.

A specific experimental example of determination of processing failure due to the thickness deviation of the external electrodes 10 and 20 and the thickness deviation of the multilayer ceramic capacitor 50 is shown in the following Table 1.

Meanwhile, in the same condition as above, $|T_{max\_L}-T_{max\_R}|$ may be less than 5 µm, and $|CT_{max\_L}-CT_{max\_R}|$ may be less than 10 µm. (Here, $T_{max\_L}$ is a maximum thickness of the external electrodes 10 and 20 in the left via processing area, $T_{max\_R}$ is a maximum thickness of the external electrodes 10 and 20 in the right via processing area, $CT_{max\_L}$ is a maximum thickness of the multilayer ceramic capacitor 50 in the left via processing area, and $CT_{max\_R}$ is a maximum thickness of the multilayer ceramic capacitor 50 in the right via processing area.)

A repeated description of the specific meaning will be omitted. A specific experimental example of determination of processing failure due to the deviation of the maximum thickness of the external electrodes 10 and 20 in the left via processing area and the maximum thickness of the external electrodes 10 and 20 in the right via processing area and the deviation of the maximum thickness of the multilayer ceramic capacitor 50 in the left via processing area and the maximum thickness of the multilayer ceramic capacitor 50 in the right via processing area is shown in the following Table 2.

Meanwhile, the multilayer ceramic 30 includes a dummy pattern 1 and a capacitance forming pattern 2 having a different polarity from the dummy pattern 1 and formed on the same layer as the dummy pattern 1, and the dummy pattern 1 and the capacitance forming pattern 2 may be formed in more than 30 layers.

In general, an external electrode is formed by a dipping method using an external electrode forming paste having a viscosity of greater than 25,000 cps. However, in case of an embedded multilayer ceramic capacitor, since a length of W, a via processing area in the external electrode, is longer than that of a common MLCC, even though flatness of a multilayer ceramic is excellent, flatness of the external electrode may be deteriorated due to the thin viscosity of the paste when applying a conventional method.

Therefore, according to the embodiment of the present invention, it is preferred that the external electrodes 10 and 20 are formed by dipping the both sides of the multilayer ceramic 30 in an external electrode forming paste and a viscosity of the external electrode forming paste is less than 18,000 cps. In addition, a blotting method may be used after dipping. This means that the external electrode forming paste stuck to the multilayer ceramic is removed by re-dipping the multilayer ceramic capacitor, which has the external electrodes formed by dipping, in a surface plate in which a small amount of the external electrode forming paste is contained.

In this case, the external electrodes 10 and 20 may be formed by performing blotting within 3 to 20 seconds, and the external electrodes 10 and 20 may be formed of the external electrode forming paste put in the surface plate at a height of 30 to 100 μm.

It means that the flatness is deteriorated since the viscosity of the external electrode forming paste is thin and that the flatness can be maintained by the viscosity of the paste when the viscosity is maintained less than 18,000 cps even using the conventional method.

TABLE 1

| No. | Dummy pattern layer number | Dummy pattern interval ratio (B/A) | Paste viscosity (cps) | Blotting time (second) | Height of paste put in surface plate (μm) | $|T_{max} - T_{min}|$ (μm) | $|CT_{max} - CT_{min}|$ (μm) | Determination |
|---|---|---|---|---|---|---|---|---|
| 1 | 0 | — | 25000 | — | — | 14.5 | 26.1 | X |
| 2 | 0 | — | 25000 | 2 | 150 | 13.4 | 24.3 | X |
| 3 | 0 | — | 25000 | 10 | 50 | 10.8 | 23.1 | X |
| 4 | 0 | — | 25000 | 30 | 20 | 11.2 | 23.9 | X |
| 5 | 0 | — | 18000 | — | — | 13.2 | 24.6 | X |
| 6 | 0 | — | 18000 | 2 | 150 | 12.8 | 23.5 | X |
| 7 | 0 | — | 18000 | 10 | 50 | 9.1 | 21.8 | X |
| 8 | 0 | — | 18000 | 30 | 20 | 12.1 | 22.5 | X |
| 9 | 0 | — | 16000 | — | — | 12.5 | 25.8 | X |
| 10 | 0 | — | 16000 | 2 | 150 | 11.8 | 24.3 | X |
| 11 | 0 | — | 16000 | 10 | 50 | 6.7 | 22.0 | X |
| 12 | 0 | — | 16000 | 30 | 20 | 11.5 | 23.1 | X |
| 13 | 10 | 0.7 | 25000 | — | — | 14.3 | 24.4 | X |
| 14 | 10 | 0.7 | 25000 | 2 | 150 | 13.7 | 23.5 | X |
| 15 | 10 | 0.7 | 25000 | 10 | 50 | 10.8 | 21.7 | X |
| 16 | 10 | 0.7 | 25000 | 30 | 20 | 11.5 | 22.6 | X |
| 17 | 10 | 0.7 | 18000 | — | — | 13.3 | 25.8 | X |
| 18 | 10 | 0.7 | 18000 | 2 | 150 | 12.5 | 24.1 | X |
| 19 | 10 | 0.7 | 18000 | 5 | 100 | 8.1 | 18.6 | ○ |
| 20 | 10 | 0.7 | 18000 | 10 | 50 | 9.4 | 19.2 | ○ |
| 21 | 10 | 0.7 | 18000 | 30 | 20 | 12.1 | 23.6 | X |
| 22 | 10 | 0.7 | 16000 | — | — | 12.4 | 23.5 | X |
| 23 | 10 | 0.7 | 16000 | 2 | 150 | 12.0 | 24.1 | X |
| 24 | 10 | 0.7 | 16000 | 5 | 100 | 7.6 | 17.6 | ○ |
| 25 | 10 | 0.7 | 16000 | 10 | 50 | 7.3 | 16.8 | ○ |
| 26 | 10 | 0.7 | 16000 | 30 | 20 | 11.3 | 22.1 | X |
| 27 | 10 | 0.5 | 25000 | — | — | 14.8 | 24.1 | X |
| 28 | 10 | 0.5 | 25000 | 2 | 150 | 13.3 | 26.7 | X |
| 29 | 10 | 0.5 | 25000 | 10 | 50 | 10.6 | 21.8 | X |
| 30 | 10 | 0.5 | 25000 | 30 | 20 | 11.6 | 23.1 | X |
| 31 | 10 | 0.5 | 18000 | — | — | 13.0 | 25.2 | X |
| 32 | 10 | 0.5 | 18000 | 2 | 150 | 12.7 | 24.9 | X |
| 33 | 10 | 0.5 | 18000 | 10 | 50 | 9.1 | 21.7 | X |
| 34 | 10 | 0.5 | 18000 | 30 | 20 | 11.8 | 23.6 | X |
| 35 | 10 | 0.5 | 16000 | — | — | 12.2 | 23.7 | X |
| 36 | 10 | 0.5 | 16000 | 2 | 150 | 11.9 | 22.9 | X |
| 37 | 10 | 0.5 | 16000 | 10 | 50 | 7.1 | 20.6 | X |
| 38 | 10 | 0.5 | 16000 | 30 | 20 | 11.7 | 22.6 | X |
| 39 | 20 | 0.7 | 25000 | — | — | 14.6 | 25.1 | X |
| 40 | 20 | 0.7 | 25000 | 2 | 150 | 13.5 | 24.3 | X |
| 41 | 20 | 0.7 | 25000 | 10 | 50 | 11.1 | 23.1 | X |
| 42 | 20 | 0.7 | 25000 | 30 | 20 | 11.3 | 22.5 | X |
| 43 | 20 | 0.7 | 18000 | — | — | 12.9 | 22.9 | X |
| 44 | 20 | 0.7 | 18000 | 2 | 150 | 12.3 | 22.3 | X |
| 45 | 20 | 0.7 | 18000 | 5 | 100 | 8.3 | 18.3 | ○ |
| 46 | 20 | 0.7 | 18000 | 10 | 50 | 9.0 | 19.1 | ○ |
| 47 | 20 | 0.7 | 18000 | 30 | 20 | 11.7 | 22.1 | X |
| 48 | 20 | 0.7 | 16000 | — | — | 12.8 | 22.6 | X |
| 49 | 20 | 0.7 | 16000 | 2 | 150 | 12.3 | 22.5 | X |
| 50 | 20 | 0.7 | 16000 | 5 | 100 | 7.5 | 17.4 | ○ |
| 51 | 20 | 0.7 | 16000 | 10 | 50 | 6.8 | 16.5 | ○ |
| 52 | 20 | 0.7 | 16000 | 30 | 20 | 11.6 | 21.6 | X |
| 53 | 20 | 0.9 | 25000 | — | — | 14.3 | 24.2 | X |
| 54 | 20 | 0.9 | 25000 | 2 | 150 | 13.7 | 23.8 | X |
| 55 | 20 | 0.9 | 25000 | 10 | 50 | 11.0 | 21.2 | X |
| 56 | 20 | 0.9 | 25000 | 30 | 20 | 11.7 | 21.6 | X |
| 57 | 20 | 0.9 | 18000 | — | — | 12.7 | 22.5 | X |
| 58 | 20 | 0.9 | 18000 | 2 | 150 | 12.8 | 22.7 | X |
| 59 | 20 | 0.9 | 18000 | 5 | 100 | 7.7 | 17.5 | ○ |
| 60 | 20 | 0.9 | 18000 | 10 | 50 | 8.2 | 18.3 | ○ |
| 61 | 20 | 0.9 | 18000 | 30 | 20 | 12.1 | 22.5 | X |

TABLE 1-continued

| No. | Dummy pattern layer number | Dummy pattern interval ratio (B/A) | Paste viscosity (cps) | Blotting time (second) | Height of paste put in surface plate (μm) | $|T_{max} - T_{min}|$ (μm) | $|CT_{max} - CT_{min}|$ (μm) | Determination |
|---|---|---|---|---|---|---|---|---|
| 62 | 20 | 0.9 | 16000 | — | — | 12.6 | 22.7 | X |
| 63 | 20 | 0.9 | 16000 | 2 | 150 | 12.4 | 22.3 | X |
| 64 | 20 | 0.9 | 16000 | 5 | 100 | 7.8 | 17.6 | ○ |
| 65 | 20 | 0.9 | 16000 | 10 | 50 | 7.1 | 17.2 | ○ |
| 66 | 20 | 0.9 | 16000 | 30 | 20 | 11.7 | 22.0 | X |

The determination in the above Table is to determine whether a via size, a via shape, etc. correspond to specifications by inspecting them. It is marked as O only when items relating to reliability, such as a via crack, are determined to satisfy the specifications, and it is marked as X when there is a problem with reliability. As shown in the above Table, when a ratio of a difference in length between a first capacitance forming pattern and a second capacitance forming pattern to an interval between a first dummy pattern and the first capacitance forming pattern is 0.7 to 1 while there is a dummy pattern, the thickness deviation of the multilayer ceramic can be maintained. (A detailed description of this is disclosed in the following description of FIG. 2.) Further, when the thickness deviation of the external electrodes 10 and 20 is less than 10 μm and the thickness deviation ($|CT_{max} - CT_{min}|$) of the multilayer ceramic capacitor 50 is less than 20 μm, the above reliability problem doesn't occur.

TABLE 2

| No. | Paste viscosity (cps) | Blotting time (second) | Height of paste put in surface plate (μm) | $|T_{max} - T_{min}|$ (μm) | $|CT_{max} - CT_{min}|$ (μm) | $|T_{max\_L} - T_{max\_R}|$ (μm) | $|CT_{max\_L} - CT_{max\_R}|$ (μm) | Determination |
|---|---|---|---|---|---|---|---|---|
| 1 | 20000 | 2 | 120 | 13.5 | 23.3 | 6.5 | 12.3 | X |
| 2 | 20000 | 2 | 100 | 13.1 | 23.4 | 6.3 | 12.0 | X |
| 3 | 20000 | 2 | 30 | 13.0 | 23.2 | 6.0 | 12.1 | X |
| 4 | 20000 | 2 | 10 | 14.4 | 24.5 | 6.7 | 13.1 | X |
| 5 | 20000 | 3 | 120 | 12.2 | 22.6 | 5.6 | 11.0 | X |
| 6 | 20000 | 3 | 100 | 10.5 | 20.7 | 5.3 | 10.2 | X |
| 7 | 20000 | 3 | 30 | 10.6 | 21.0 | 5.2 | 10.6 | X |
| 8 | 20000 | 3 | 10 | 14.1 | 24.3 | 6.8 | 13.0 | X |
| 9 | 20000 | 20 | 120 | 13.8 | 23.7 | 6.3 | 12.6 | X |
| 10 | 20000 | 20 | 100 | 10.6 | 21.2 | 5.2 | 10.4 | X |
| 11 | 20000 | 20 | 30 | 10.7 | 20.9 | 5.4 | 10.8 | X |
| 12 | 20000 | 20 | 10 | 12.5 | 22.6 | 5.8 | 11.1 | X |
| 13 | 20000 | 30 | 120 | 14.6 | 24.8 | 6.9 | 13.3 | X |
| 14 | 20000 | 30 | 100 | 13.8 | 23.7 | 6.3 | 12.7 | X |
| 15 | 20000 | 30 | 30 | 11.7 | 22.9 | 5.6 | 10.8 | X |
| 16 | 20000 | 30 | 10 | 12.5 | 23.1 | 5.8 | 11.2 | X |
| 17 | 18000 | 2 | 120 | 12.5 | 22.8 | 5.8 | 11.3 | X |
| 18 | 18000 | 2 | 100 | 12.0 | 22.2 | 5.6 | 11.0 | X |
| 19 | 18000 | 2 | 30 | 12.0 | 22.1 | 5.9 | 11.9 | X |
| 20 | 18000 | 2 | 10 | 13.1 | 24.0 | 6.7 | 12.5 | X |
| 21 | 18000 | 3 | 120 | 11.0 | 21.2 | 6.0 | 11.0 | X |
| 22 | 18000 | 3 | 100 | 9.5 | 19.6 | 4.5 | 9.6 | ○ |
| 23 | 18000 | 3 | 30 | 8.7 | 18.5 | 3.7 | 8.5 | ○ |
| 24 | 18000 | 3 | 10 | 13.0 | 23.4 | 6.3 | 12.1 | X |
| 25 | 18000 | 20 | 120 | 12.6 | 23.7 | 6.1 | 12.0 | X |
| 26 | 18000 | 20 | 100 | 9.0 | 18.9 | 4.1 | 8.7 | ○ |
| 27 | 18000 | 20 | 30 | 9.2 | 19.1 | 4.7 | 9.1 | ○ |
| 28 | 18000 | 20 | 10 | 11.1 | 21.2 | 5.4 | 10.5 | X |
| 29 | 18000 | 30 | 120 | 13.3 | 23.5 | 6.6 | 12.3 | X |
| 30 | 18000 | 30 | 100 | 12.7 | 23.1 | 6.2 | 11.7 | X |
| 31 | 18000 | 30 | 30 | 10.8 | 20.7 | 5.5 | 10.6 | X |
| 32 | 18000 | 30 | 10 | 11.2 | 21.5 | 5.7 | 10.2 | X |
| 33 | 16000 | 2 | 120 | 12.7 | 23.0 | 6.6 | 11.5 | X |
| 34 | 16000 | 2 | 100 | 12.3 | 22.3 | 5.5 | 10.6 | X |
| 35 | 16000 | 2 | 30 | 11.8 | 21.7 | 5.8 | 11.7 | X |
| 36 | 16000 | 2 | 10 | 13.1 | 23.2 | 6.3 | 12.4 | X |
| 37 | 16000 | 3 | 120 | 11.0 | 21.2 | 5.8 | 11.5 | X |
| 38 | 16000 | 3 | 100 | 8.3 | 8.1 | 4.6 | 9.2 | ○ |
| 39 | 16000 | 3 | 30 | 7.5 | 17.5 | 4.1 | 8.3 | ○ |
| 40 | 16000 | 3 | 10 | 12.0 | 22.1 | 6.0 | 12.1 | X |
| 41 | 16000 | 20 | 120 | 11.8 | 21.9 | 6.3 | 12.0 | X |
| 42 | 16000 | 20 | 100 | 8.2 | 18.0 | 4.2 | 8.5 | ○ |
| 43 | 16000 | 20 | 30 | 7.8 | 18.1 | 4.5 | 9.3 | ○ |
| 44 | 16000 | 20 | 10 | 11.3 | 21.4 | 5.5 | 10.7 | X |

TABLE 2-continued

| No. | Paste viscosity (cps) | Blotting time (second) | Height of paste put in surface plate (μm) | $|T_{max} - T_{min}|$ (μm) | $|CT_{max} - CT_{min}|$ (μm) | $|T_{max\_L} - T_{max\_R}|$ (μm) | $|CT_{max\_L} - CT_{max\_R}|$ (μm) | Determination |
|---|---|---|---|---|---|---|---|---|
| 45 | 16000 | 30 | 120 | 12.8 | 22.5 | 6.1 | 12.1 | X |
| 46 | 16000 | 30 | 100 | 12.5 | 22.6 | 5.6 | 11.5 | X |
| 47 | 16000 | 30 | 30 | 11.2 | 21.3 | 5.3 | 10.4 | X |
| 48 | 16000 | 30 | 10 | 12.0 | 22.1 | 5.8 | 10.9 | X |

As shown in the above Table, the viscosity of the external electrode forming paste should be less than 18,000 cps, the blotting time should be 3 to 20 seconds, and the height of the external electrode forming paste put in the surface plate during blotting should be 30 to 100 μm. Further, when the thickness deviation of the external electrodes 10 and 20 is less than 10 μm and the thickness deviation ($|CT_{max} - CT_{min}|$) of the multilayer ceramic capacitor 50 is less than 20 μm and when $|T_{max\_L} - T_{max\_R}|$ is less than 5 μm and $|CT_{max} - CT_{min}|$ is less than 10 μm, the above reliability problem doesn't occur.

Therefore, the results in the following Table 3 can be obtained by putting the results shown in Table 1 and Table 2 together under the condition that the reliability problem doesn't occur.

TABLE 3

| No. | $|T_{max} - T_{min}|$ (μm) | $|CT_{max} - CT_{min}|$ (μm) | $|T_{max\_L} - T_{max\_R}|$ (μm) | $|CT_{max\_L} - CT_{max\_R}|$ (μm) | Determination |
|---|---|---|---|---|---|
| 1 | 8.5 | 17.6 | 4.2 | 8.8 | ○ |
| 2 | 8.7 | 17.0 | 4.3 | 8.7 | ○ |
| 3 | 8.3 | 16.7 | 4.2 | 8.8 | ○ |
| 4 | 8.4 | 16.9 | 4.0 | 8.7 | ○ |
| 5 | 8.4 | 17.2 | 3.9 | 8.8 | ○ |
| 6 | 8.6 | 17.3 | 4.2 | 9.1 | ○ |
| 7 | 8.3 | 16.2 | 4.3 | 8.8 | ○ |
| 8 | 8.2 | 17.3 | 4.1 | 8.4 | ○ |
| 9 | 8.2 | 17.6 | 4.2 | 8.8 | ○ |
| 10 | 8.5 | 17.2 | 4.2 | 8.9 | ○ |
| 11 | 8.5 | 17.9 | 4.1 | 8.5 | ○ |
| 12 | 8.5 | 16.9 | 4.0 | 8.5 | ○ |
| 13 | 8.4 | 17.0 | 3.9 | 8.7 | ○ |
| 14 | 8.5 | 16.4 | 4.1 | 8.6 | ○ |
| 15 | 8.7 | 18.0 | 4.2 | 8.6 | ○ |
| 16 | 8.5 | 17.1 | 4.3 | 8.9 | ○ |
| 17 | 8.7 | 16.8 | 4.2 | 8.6 | ○ |
| 18 | 9.0 | 16.9 | 4.1 | 8.9 | ○ |
| 19 | 9.0 | 17.6 | 4.2 | 8.4 | ○ |
| 20 | 9.1 | 16.9 | 4.0 | 8.4 | ○ |
| 21 | 8.3 | 16.4 | 4.1 | 8.5 | ○ |
| 22 | 8.5 | 16.8 | 4.2 | 9.1 | ○ |
| 23 | 8.8 | 16.8 | 4.0 | 8.6 | ○ |
| 24 | 8.5 | 16.9 | 4.2 | 9.0 | ○ |
| 25 | 8.3 | 16.7 | 4.1 | 8.3 | ○ |
| 26 | 8.5 | 18.0 | 4.1 | 8.6 | ○ |
| 27 | 8.6 | 17.9 | 4.3 | 8.8 | ○ |
| 28 | 8.2 | 16.6 | 4.0 | 8.7 | ○ |
| 29 | 8.6 | 16.9 | 4.0 | 9.0 | ○ |
| 30 | 8.3 | 17.2 | 4.0 | 8.8 | ○ |

Figure 3:
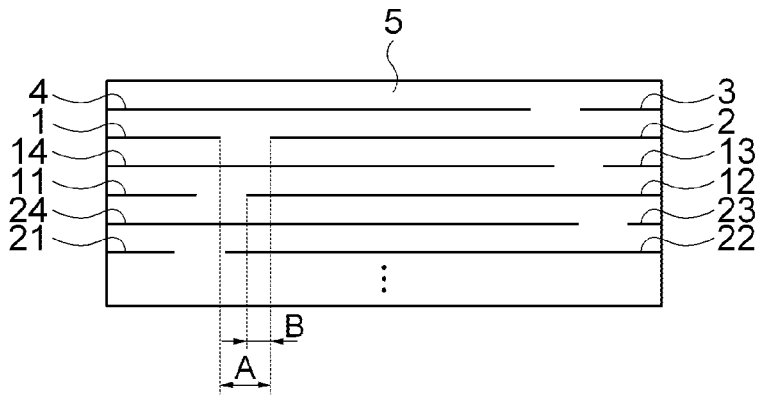
FIG. 3 is a cross-sectional view of a multilayer ceramic in accordance with the embodiment of the present invention.

FIG. 3 is a cross-sectional view of the multilayer ceramic in accordance with the embodiment of the present invention.

Referring to FIG. 3, the multilayer ceramic 30 in accordance with the present invention includes a first dummy pattern 1; a first capacitance forming pattern 2 having a different polarity from the first dummy pattern 1 and formed on the same layer as the first dummy pattern 1; a second dummy pattern 11 having the same polarity as the first dummy pattern 1 and formed on a different layer from the first dummy pattern 1; and a second capacitance forming pattern 12 having a different polarity from the second dummy pattern 11 and formed on the same layer as the second dummy pattern 11 and is characterized in that an interval between the first dummy pattern 1 and the first capacitance forming pattern 2 is substantially equal to an interval between the second dummy pattern 11 and the second capacitance forming pattern 12 and a length of the first dummy pattern 1 is longer than a length of the second dummy pattern 11.

In general, in case of a multilayer ceramic having a large number of laminations, a center portion of the multilayer ceramic is convex vertically due to a difference in density between a portion in which internal electrodes are overlapped with each other and a portion in which the internal electrodes aren't overlapped with each other. Therefore, in the embedded MLCC, it is required to make the flatness of the multilayer ceramic excellent due to the thickness deviation, that is, a height difference of the multilayer ceramic.

A ratio of a difference (B) in length between the first capacitance forming pattern 2 and the second capacitance forming pattern 12 to the interval (A) between the first dummy pattern 1 and the first capacitance forming pattern 2, that is, B/A may be 0.7 to 1, and the first dummy pattern 1 and the second dummy pattern 11 may be laminated vertically with one ceramic insulating layer 5 interposed therebetween.

Further, the multilayer ceramic 30 may further include a third dummy pattern 3 having a different polarity from the first dummy pattern 1 and formed with the same length as the first dummy pattern 1; a third capacitance forming pattern 4 having a different polarity from the first capacitance forming pattern 2 and formed with the same length as the first capacitance forming pattern 2; a fourth dummy pattern 13 having a different polarity from the second dummy pattern 11 and formed with the same length as the second dummy pattern 11; and a fourth capacitance forming pattern 14 having a different polarity from the second capacitance forming pattern 12 and formed with the same length as the second capacitance forming pattern 12.

In this case, the third dummy pattern 3 and the third capacitance forming pattern 4 may be formed on the same layer, the fourth dummy pattern 13 and the fourth capacitance forming pattern 14 may be formed on the same layer, the third dummy pattern 3 may be formed between the first capacitance forming pattern 2 and the second capacitance forming pattern 12, and the fourth dummy pattern 13 may be formed under the second capacitance forming pattern 12 with one ceramic insulating layer 5 interposed therebetween.

The first dummy pattern 1 and the first capacitance forming pattern 2, the second dummy pattern 11 and the second capacitance forming pattern 12, the third dummy pattern 3 and the third capacitance forming pattern 4, and the fourth dummy pattern 13 and the fourth capacitance forming pattern 14 may be plural and stacked in more than 30 layers. Here, the dummy pattern and the capacitance forming pattern are formed on the ceramic insulating layer 5 made of a dielectric in parallel, and a plurality of ceramic insulating layers 5 on which the dummy patterns and the capacitance forming patterns are formed are stacked in the vertical direction.

The multilayer ceramic capacitor applied to the embodiment of the present invention is manufactured through the following process.

A plurality of ceramic green sheets with a thickness of 1.4 μm are prepared by applying slurry including powder such as barium titanate (BaTiO$_3$) on a carrier film and drying the applied slurry. Next, an internal electrode is formed by applying a conductive paste for a nickel internal electrode on the ceramic green sheet using a screen.

The ceramic green sheets are laminated in about 40 layers, and the laminate is compression-molded and cut in the form of individual chips. The cut chip is debindered at a temperature of 200 to 250° C. for 20 to 60 hours.

After that, the chip is sintered in a reducing atmosphere so that the internal electrode is not oxidized at 1150 to 1200° C.

Next, a multilayer ceramic capacitor is manufactured by passing through a process of forming an external electrode, a process of Cu plating, etc. The length (L) and width (W) of the completed multilayer chip capacitor is about 1.00 mm×0.5 mm (L×W, 1005 size).

Here, a manufacturing tolerance of the completed multilayer ceramic 30 is determined within a range of ±0.05 mm based on L×W.

Figure 4:
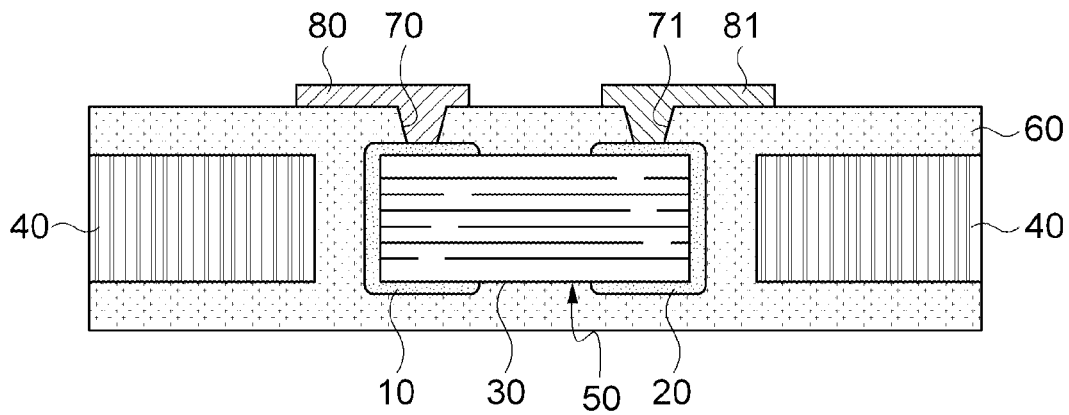
FIG. 4 is a cross-sectional view of a printed circuit board in accordance with an embodiment of the present invention.

FIG. 4 is a cross-sectional view of a printed circuit board in accordance with an embodiment of the present invention.

Referring to FIG. 4, a printed circuit board 100 in accordance with the embodiment of the present invention includes a multilayer ceramic capacitor 50 including a multilayer ceramic 30 and external electrodes 10 and 20 formed on both sides of the multilayer ceramic 30; a core layer 40 having a cavity for mounting the multilayer ceramic capacitor 50 therein; an insulating layer 60 formed between the multilayer ceramic capacitor 50 and the cavity and on upper and lower surfaces of the core layer 40; via holes 70 and 71 formed in the insulating layer 60 for electrical conduction of the external electrodes 10 and 20; and circuit layer 80 and 81 formed on the insulating layer 60, wherein $|T_{max}-T_{min}|$ of the multilayer ceramic capacitor 50 may be less than 10 μm, and $|CT_{max}-CT_{min}|$ thereof may be less than 20 μm. (Here, $T_{max}$ is a maximum thickness of the external electrodes 10 and 20 in a via processing area, $T_{min}$ is a minimum thickness of the external electrodes 10 and 20 in the via processing area, $CT_{max}$ is a maximum thickness of the multilayer ceramic capacitor 50 in the via processing area, and $CT_{min}$ is a minimum thickness of the multilayer ceramic capacitor 50 in the via processing area.) Here, $|T_{max\_L}-T_{max\_R}|$ may be less than 5 μm, and $|CT_{max\_L}-CT_{max\_R}|$ may be less than 10 μm. (Here, $T_{max\_L}$ is a maximum thickness of the external electrodes 10 and 20 in a left via processing area, $T_{max\_R}$ is a maximum thickness of the external electrodes 10 and 20 in a right via processing area, $CT_{max\_L}$ is a maximum thickness of the multilayer ceramic capacitor 50 in the left via processing area, and $CT_{max\_R}$ is a maximum thickness of the multilayer ceramic capacitor 50 in the right via processing area.) Descriptions of the contents overlapping with the contents described in FIG. 1 will be omitted.

The core layer 40 may be formed on the same layer as the multilayer ceramic capacitor 50 and spaced apart from the external electrodes 10 and 20 by a predetermined interval. Further, the insulating layer 60 may be formed on the upper and lower surfaces of the core layer 40, between the core layer 40 and the external electrodes 10 and 20, and on upper and lower surfaces of the multilayer ceramic capacitor 50, and the via holes 70 and 71 may be formed on one side of an upper or lower surface of the external electrodes 10 and 20 for the electrical conduction with the circuit layers 80 and 81.

In this case, the via holes 70 and 71 include a first via hole 70; and a second via hole 71, and the first via hole 70 and the second via hole 71 may be formed in an upper portion or a lower portion of the insulating layer 60.

Figure 5:
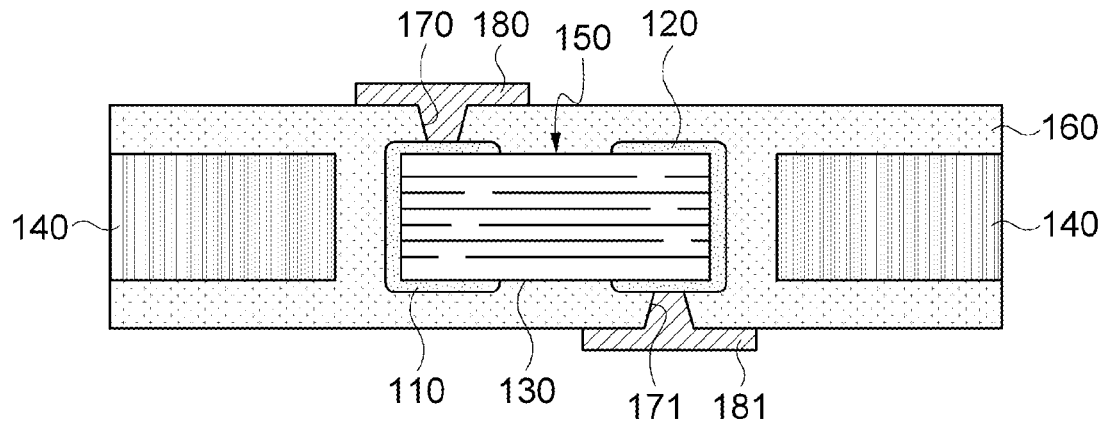
FIG. 5 is a cross-sectional view of a printed circuit board in accordance with another embodiment of the present invention.

FIG. 5 is a cross-sectional view of a printed circuit board in accordance with another embodiment of the present invention.

Referring to FIG. 5, via holes 170 and 171 include a first via hole 170 having a positive polarity; and a second via hole 171 having a negative polarity, and the first via hole 170 and the second via hole 171 may be formed in upper and lower portions of an insulating layer 160, respectively or the first via hole 170 and the second via hole 171 may be formed in the lower and upper portions of the insulating layer 160, respectively. In this case, the first via hole 170 may have a negative polarity, and the second via hole 171 may have a positive polarity.

Meanwhile, a method of manufacturing a printed circuit board in which the above-described multilayer ceramic capacitor is embedded will be briefly described below.

First, a core substrate (CCL) corresponding to a thickness of the multilayer ceramic capacitor is prepared. And, a reference hole and a through hole are processed in the core substrate using a CNC drill or laser. Pretreatment and patterning are performed on the core substrate having the holes to form a cavity, an alignment mark, and a circuit. The cavity is formed in the patterned core substrate using laser or a CNC drill to embed an electronic component or the multilayer ceramic capacitor therein.

Next, a desmearing process is performed to remove smear formed when processing the holes using laser or a CNC drill, and surface treatment is performed on a surface of an insulating layer on which a copper pattern is formed to secure adhesion between the insulating layers. An adhesive film is attached inside the cavity of the surface-treated core substrate, and the multilayer ceramic capacitor (MLCC) is positioned on the adhesive film inside the cavity using the alignment mark.

A temporarily cured insulating material is laminated on the core substrate and cured in a state in which the multilayer ceramic capacitor fixed to the adhesive film of the cavity is inserted, and a resin included in the temporarily cured insulating material flows around the multilayer ceramic capacitor and is cured to fix the multilayer ceramic capacitor.

At this time, the insulating material may be a resin material such as prepreg, RCC, or ABF. The insulating material is laminated at appropriate lamination temperature and pressure according to the kind thereof to generate a resin flow so that the multilayer ceramic capacitor can be inserted in the cavity.

Next, when the multilayer ceramic capacitor is fixed inside the cavity of the core substrate, the adhesive film is removed, and the insulating material and a copper foil are laminated on the surface from which the adhesive film is removed. And, the insulating materials are cured at appropriate temperature and pressure so that the insulating material laminated on the other surface is also completely cured.

A through hole is formed in the core substrate having the insulating materials laminated on the both surfaces using a CNC drill, and a via is processed to a position of an electrode of the multilayer ceramic capacitor embedded in the substrate using laser. When the formation of the via is completed by laser processing, a patterning process for forming a circuit is performed after a surface treatment process such as desmearing.

After that, a multilayer substrate with the embedded multilayer ceramic capacitor is manufactured by repeating a process of laminating an insulating material and a copper foil, a process of forming a via, and a process of forming a circuit according to the number of required layers of the substrate.

An experimental example and an evaluation method for proving connection reliability relationship between the via of the printed circuit board and the external electrode of the multilayer ceramic capacitor shown in Tables 1 to 3 using the printed circuit board with the embedded multilayer ceramic capacitor manufactured as above evaluate contact reliability of the via by verifying that cracks of the via occur by thermal cycling (TC) due to a difference in coefficient of thermal expansion when the thickness deviation of the external electrode of the multilayer ceramic capacitor and the entire thickness deviation of the multilayer ceramic capacitor are increased.

TC conditions are evaluated by JESD22-A104D standards, and the degree of occurrence of cracks is evaluated after 500 cycles/1000 cycles up to −65 to 150° C.

At this time, the occurrence of cracks in the via is verified by applying a high voltage (200V) to the upper and lower vias connected to the electrodes of the multilayer ceramic capacitor in the printed circuit board with the embedded multilayer ceramic capacitor.

At this time, it is possible to know the occurrence of cracks in the via since the crack of the cracked via is expanded when a high voltage is applied and thus resistance is increased to more than tens of ohms.

According to the present invention as above, since the thickness deviation of the external electrode of the multilayer ceramic capacitor is small, it is possible to reduce failures in processing the via hole by laser.

Further, it is possible to reduce the thickness of the printed circuit board by minimizing the occurrence of failures even though the thickness of the multilayer ceramic capacitor is reduced, and it is possible to overcome problems with filling the resin by reducing the thickness deviation of the multilayer ceramic capacitor even though the flowability of the resin is low in a substrate using a low CTE material.

Further, it is possible to reduce the failure rate due to the bottom size of the via by making the thickness of the external electrode of the multilayer ceramic capacitor uniform according to the trend that the size of the via becomes smaller.

Although the present invention has been described in detail through the representative embodiments, it will be appreciated by those skilled in the art that various changes and modifications may be made in these embodiments without departing from the scope of the invention.

Therefore, the scope of the present invention should not be limited to the above-described embodiments but should be determined by the appended claims and any equivalents thereof.

What is claimed is:

1. A multilayer ceramic capacitor comprising a multilayer ceramic and external electrodes formed on both sides of the multilayer ceramic, wherein
    |Tmax−Tmin| is less than 10 μm, where Tmax is a maximum thickness of the external electrodes in a via processing area, and Tmin is a minimum thickness of the external electrodes in the via processing area, and
    |CTmax−CTmin| is a less than 20 μm, where CTmax is a maximum thickness of the multilayer ceramic capacitor in the via processing area, and CTmin is a minimum thickness of the multilayer ceramic capacitor in the via processing area.

2. The multilayer ceramic capacitor according to claim 1, wherein
    |Tmax_L−Tmax_R| is less than 5 μm, where Tmax L is a maximum thickness of the external electrodes in a left via processing area, Tmax R is a maximum thickness of the external electrodes in a right via processing area, and
    |CTmax_L−CTmax_R| is less than 10 μm, where CTmax L is a maximum thickness of the multilayer ceramic capacitor in the left via processing area, and CTmax R is a maximum thickness of the multilayer ceramic capacitor in the right via processing area.

3. The multilayer ceramic capacitor according to claim 1, wherein the multilayer ceramic comprises:
    a dummy pattern; and
    a capacitance forming pattern having a different polarity from the dummy pattern and formed on the same layer as the dummy pattern, wherein the dummy pattern and the capacitance forming pattern are formed in more than 30 layers.

4. The multilayer ceramic capacitor according to claim 1, wherein the external electrodes are formed by dipping the both sides of the multilayer ceramic in an external electrode forming paste, wherein a viscosity of the external electrode forming paste is less than 18,000 cps.

5. The multilayer ceramic capacitor according to claim 4, wherein the external electrodes are formed by performing blotting within 3 to 20 seconds.

6. The multilayer ceramic capacitor according to claim 4, wherein the external electrodes are formed of the external electrode forming paste which is put in a surface plate at a height of 30 to 100 μm during blotting.

7. The multilayer ceramic capacitor according to claim 1, wherein the multilayer ceramic comprises:
    a first dummy pattern;
    a first capacitance forming pattern having a different polarity from the first dummy pattern and formed on the same layer as the first dummy pattern;
    a second dummy pattern having the same polarity as the first dummy pattern and formed on a different layer from the first dummy pattern; and
    a second capacitance forming pattern having a different polarity from the second dummy pattern and formed on the same layer as the second dummy pattern, wherein an interval between the first dummy pattern and the first capacitance forming pattern is equal to an interval between the second dummy pattern and the second capacitance forming pattern, and a length of the first dummy pattern is longer than a length of the second dummy pattern.

8. The multilayer ceramic capacitor according to claim 7, wherein a ratio(B/A) of a difference (B) in length between the first capacitance forming pattern and the second capacitance forming pattern to the interval (A) between the first dummy pattern and the first capacitance forming pattern is in a range of 0.7 to 1.

9. The multilayer ceramic capacitor according to claim 8, wherein the first dummy pattern and the second dummy pattern are stacked vertically with one ceramic insulating layer interposed therebetween.

10. The multilayer ceramic capacitor according to claim 9, further comprising:
    a third dummy pattern having a different polarity from the first dummy pattern and formed with the same length as the first dummy pattern;

a third capacitance forming pattern having a different polarity from the first capacitance forming pattern and formed with the same length as the first capacitance forming pattern;

a fourth dummy pattern having a different polarity from the second dummy pattern and formed with the same length as the second dummy pattern; and a fourth capacitance forming pattern having a different polarity from the second capacitance forming pattern and formed with the same length as the second capacitance forming pattern.

11. The multilayer ceramic capacitor according to claim 10, wherein the third dummy pattern and the third capacitance forming pattern are formed on the same layer, and the fourth dummy pattern and the fourth capacitance forming pattern are formed on the same layer.

12. The multilayer ceramic capacitor according to claim 11, wherein the third dummy pattern is formed between the first capacitance forming pattern and the second capacitance forming pattern, and the fourth dummy pattern is formed under the second capacitance forming pattern with one ceramic insulating layer interposed therebetween.

13. The multilayer ceramic capacitor according to claim 12, wherein the first dummy pattern and the first capacitance forming pattern, the second dummy pattern and the second capacitance forming pattern, the third dummy pattern and the third capacitance forming pattern, and the fourth dummy pattern and the fourth capacitance forming pattern are plural.

14. A printed circuit board comprising:
a multilayer ceramic capacitor comprising a multilayer ceramic and external electrodes formed on both sides of the multilayer ceramic;
a core layer having a cavity for mounting the multilayer ceramic capacitor therein;
an insulating layer formed between the multilayer ceramic capacitor and the cavity and on upper and lower surfaces of the core layer;
via holes formed in the insulating layer for electrical conduction of the external electrodes; and
circuit layers formed on the insulating layer, wherein
|Tmax−Tmin| of the multilayer ceramic capacitor is less than 10 μm, where Tmax is a maximum thickness of the external electrodes in a via processing area, and Tmin is a minimum thickness of the external electrodes in the via processing area, and
|CTmax−CTmin| of the multilayer ceramic capacitor is less than 20 μm, where CTmax is a maximum thickness of the multilayer ceramic capacitor in the via processing area, and CTmin is a minimum thickness of the multilayer ceramic capacitor in the via processing area.

15. The printed circuit board according to claim 14, wherein
|Tmax_L−Tmax_R| is less than 5 μm, where Tmax L is a maximum thickness of the external electrodes in a left via processing area, and Tmax R is a maximum thickness of the external electrodes in a right via processing area, and
|CTmax_L−CTmax_R| is less than 10 μm, where CTmax L is a maximum thickness of the multilayer ceramic capacitor in the left via processing area, and CTmax R is a maximum thickness of the multilayer ceramic capacitor in the right via processing area.

16. The printed circuit board according to claim 14, wherein the via holes are formed in plural and formed in at least one of the upper insulating layer and the lower insulating layer.

17. The printed circuit board according to claim 14, wherein the via holes comprise:
a first via hole having a positive polarity; and
a second via hole having a negative polarity, wherein the first via hole and the second via hole are formed in the upper and lower portions of the insulating layer, respectively or formed in the lower and upper portions of the insulating layer, respectively.

18. The printed circuit board according to claim 14, wherein the multilayer ceramic comprises:
a dummy pattern; and
a capacitance forming pattern having a different polarity from the dummy pattern and formed on the same layer as the dummy pattern, wherein the dummy pattern and the capacitance forming pattern are formed in more than 30 layers.

19. The printed circuit board according to claim 14, wherein the external electrodes are formed by dipping the both sides of the multilayer ceramic in an external electrode forming paste, wherein a viscosity of the external electrode forming paste is less than 18,000 cps.

20. The printed circuit board according to claim 19, wherein the external electrodes are formed by performing blotting within 3 to 20 seconds.

21. The printed circuit board according to claim 19, wherein the external electrodes are formed of the external electrode forming paste which is put in a surface plate at a height of 30 to 100 μm during blotting.

22. The printed circuit board according to claim 14, wherein the multilayer ceramic comprises:
a first dummy pattern;
a first capacitance forming pattern having a different polarity from the first dummy pattern and formed on the same layer as the first dummy pattern;
a second dummy pattern having the same polarity as the first dummy pattern and formed on a different layer from the first dummy pattern; and
a second capacitance forming pattern having a different polarity from the second dummy pattern and formed on the same layer as the second dummy pattern, wherein an interval between the first dummy pattern and the first capacitance forming pattern is equal to an interval between the second dummy pattern and the second capacitance forming pattern, and a length of the first dummy pattern is longer than a length of the second dummy pattern.

23. The printed circuit board according to claim 22, wherein a ratio (B/A) of a difference (B) in length between the first capacitance forming pattern and the second capacitance forming pattern to the interval (A) between the first dummy pattern and the first capacitance forming pattern is in a range of 0.7 to 1.

24. The printed circuit board according to claim 23, wherein the first dummy pattern and the second dummy pattern are stacked vertically with one ceramic insulating layer interposed therebetween.

25. The printed circuit board according to claim 24, further comprising:
a third dummy pattern having a different polarity from the first dummy pattern and formed with the same length as the first dummy pattern;
a third capacitance forming pattern having a different polarity from the first capacitance forming pattern and formed with the same length as the first capacitance forming pattern;

a fourth dummy pattern having a different polarity from the second dummy pattern and formed with the same length as the second dummy pattern; and a fourth capacitance forming pattern having a different polarity from the second capacitance forming pattern and formed with the same length as the second capacitance forming pattern.

26. The printed circuit board according to claim 25, wherein the third dummy pattern and the third capacitance forming pattern are formed on the same layer, and the fourth dummy pattern and the fourth capacitance forming pattern are formed on the same layer.

27. The printed circuit board according to claim 26, wherein the third dummy pattern is formed between the first capacitance forming pattern and the second capacitance forming pattern, and the fourth dummy pattern is formed under the second capacitance forming pattern with one ceramic insulating layer interposed therebetween.

28. The printed circuit board according to claim 27, wherein the first dummy pattern and the first capacitance forming pattern, the second dummy pattern and the second capacitance forming pattern, the third dummy pattern and the third capacitance forming pattern, and the fourth dummy pattern and the fourth capacitance forming pattern are plural.

* * * * *